United States Patent
Kao et al.

(10) Patent No.: US 8,803,609 B2
(45) Date of Patent: Aug. 12, 2014

(54) BANDWIDTH EXTENSION OF AN AMPLIFIER

(75) Inventors: Shuo-Chun Kao, Sunnyvale, CA (US); Scott McLeod, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 26 days.

(21) Appl. No.: 13/468,769

(22) Filed: May 10, 2012

(65) Prior Publication Data

US 2013/0300501 A1    Nov. 14, 2013

(51) Int. Cl.
*H03F 3/45* (2006.01)

(52) U.S. Cl.
USPC .......................................................... 330/253

(58) Field of Classification Search
USPC .................. 330/253, 254, 277, 278
See application file for complete search history.

(56) References Cited

U.S. PATENT DOCUMENTS

| | | | |
|---|---|---|---|
| 6,340,899 B1 | 1/2002 | Green | |
| 6,765,377 B1 | 7/2004 | Lu | |
| 7,042,317 B2 | 5/2006 | Xiao et al. | |
| 7,215,194 B2 | 5/2007 | Kucharski et al. | |
| 7,532,069 B2 * | 5/2009 | Ito et al. | 330/253 |
| 7,663,438 B2 * | 2/2010 | Suzuki | 330/253 |
| 8,390,609 B2 * | 3/2013 | Tsuchi | 330/253 |
| 2004/0113691 A1 * | 6/2004 | Kwon et al. | 330/254 |
| 2011/0025418 A1 * | 2/2011 | Aram | 330/253 |

OTHER PUBLICATIONS

Saekinger et al., "A 3-GHz 32-dB CMOS limiting amplifier for SONET OC-48 receiver," IEEE J. Solid-State Circuits, vol. 35, No. 12, pp. 1884-1888, Dec. 2000.
Galal et al., "10-Gb/s limiting amplifier and laser/modulator driver in 0.18 um CMOS technology," IEEE J. Solid-State Circuits, vol. 38, No. 12, pp. 2138-2146, Dec. 2003.
Cherry et al., "The design of wide-band transistor feedback amplifiers," in Proc. Inst. Electr. Eng., Feb. 1963, vol. 110, pp. 375-389.
Chen et al., "A 1.8-V 10-Gb/s fully integrated CMOS optical receiver analog front-end," IEEE J. Solid-State Circuits, vol. 40, No. 6, pp. 1388-1396, Jun. 2005.

* cited by examiner

*Primary Examiner* — Khanh V Nguyen
(74) *Attorney, Agent, or Firm* — Maschoff Brennan (57) ABSTRACT

An amplifier may include a gain stage configured to convert an input voltage signal to a current signal and to amplify the input voltage signal according to a gain. The amplifier may also include a buffer stage coupled to the gain stage at an internal node. The buffer stage may be configured to convert the current signal to an output voltage signal and to buffer the current signal from the gain stage so that a frequency bandwidth of the amplifier may be approximately maintained when the gain of the gain stage is increased.

20 Claims, 8 Drawing Sheets

«BANDWIDTH EXTENSION OF AN AMPLIFIER»

FIELD

The embodiments discussed herein are related to electrical circuits.

BACKGROUND

As data speeds increase, the frequency bandwidth requirement of circuit elements for transmitting data at increased data speeds also increases. Extending the frequency bandwidth of some circuit elements may affect how the circuit elements perform. For example, extending the frequency bandwidth of an amplifier may lead to a reduction in a gain of the amplifier. A decrease in amplifier gain may render a circuit inoperable. However, not extending the frequency bandwidth of the amplifier may also render a circuit inoperable.

To account for the decrease in gain typically encountered when extending the frequency bandwidth of an amplifier, the amplifier may be modified. For example, an amplifier may be integrated into a circuit that includes inductors to take advantage of inductive peaking Inductive peaking may assist in maintaining a frequency bandwidth of an amplifier when the gain is increased or extending the frequency bandwidth of an amplifier at a preset gain. The frequency response that may be achieved using inductive peaking, however, may be sensitive to minor variations in the inductance used to produce the inductive peaking In some circumstances, a minor variation of the inductance of an inductor used with an amplifier to produce inductive peaking may not produce the desired frequency bandwidth extension. Furthermore, the relatively large footprint of inductors may be undesirable in circuit design with limited silicon area.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, an amplifier may include a gain stage configured to convert an input voltage signal to a current signal and to amplify the input voltage signal according to a gain. The amplifier may also include a buffer stage coupled to the gain stage at an internal node. The buffer stage may be configured to convert the current signal to an output voltage signal and to buffer the current signal from the gain stage so that a frequency bandwidth of the amplifier may be approximately maintained when the gain of the gain stage is increased.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Some embodiments described herein may include an amplifier that may include a gain stage configured to convert an input voltage signal to a current signal and to amplify the input voltage signal according to a gain. The amplifier may also include a buffer stage coupled to the gain stage at an internal node. The buffer stage may be configured to convert the current signal to an output voltage signal and to buffer the current signal from the gain stage so that a frequency bandwidth of the amplifier may be approximately maintained when the gain of the gain stage is increased. The frequency bandwidth of the amplifier may be approximately maintained when the gain of the gains stage is increased by the buffer stage providing an input impedance at the internal node that causes a Resistor-Capacitor (RC) time constant at the internal node to be lower than an RC time constant at an output node of the amplifier.

Embodiments of the present invention will be explained with reference to the accompanying drawings.

Figure 1:
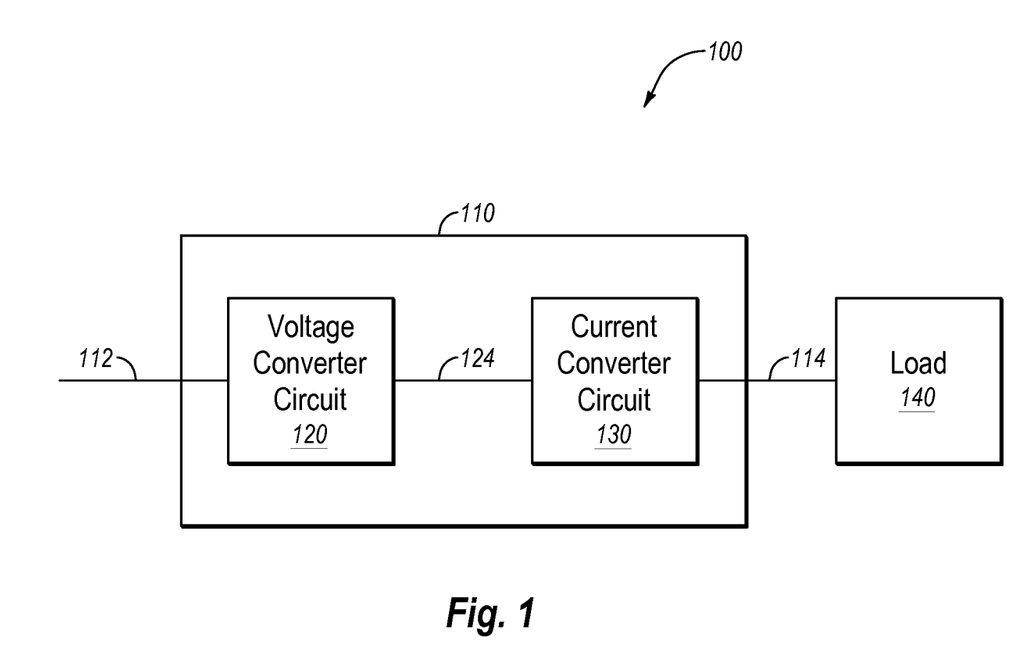
FIG. 1 illustrates an example circuit that includes an amplifier circuit.

FIG. 1 illustrates an example circuit 100 that includes an amplifier circuit 110, arranged in accordance with at least some embodiments described herein. The amplifier circuit 100 may include, but is not limited to, a voltage converter circuit 120 coupled to an input node 112. The voltage converter circuit 120 may also be coupled to a current converter circuit 130 by an internal node 124. The current converter circuit 130 may be coupled to an output node 114. In some embodiments, the output node 114 may be coupled to a load 140.

The input node 112 may be configured to receive an input voltage signal and to send the input voltage signal to the voltage converter circuit 120. The voltage converter circuit 120 may be configured to convert the input voltage signal to a current signal and to place the current signal on the internal node 124. The voltage converter circuit 120 may also be configured to amplify the input voltage signal according to a gain of the voltage converter circuit 120 when converting the input voltage signal to the current signal. Thus, in some embodiments, the voltage converter circuit 120 may be referred to as a gain stage of the amplifier circuit 110.

The current converter circuit 130 may obtain the current signal from the internal node 124 and may be configured to convert the current signal to an output voltage signal. The current converter circuit 130 may place the output voltage signal on the output node 114. In some embodiments, the current converter circuit 130 may have approximately a unity gain.

The current converter circuit 130 may also be configured to buffer the current signal from the voltage converter circuit 120 and may be referred to as a buffer stage of the amplifier circuit 110. The current converter circuit 130 may buffer the current signal from the voltage converter circuit 120 by providing an input impedance at the internal node 124 with a low enough value so that an RC time constant at the internal node 124, resulting from the input impedance of the current converter circuit 130 and a parasitic capacitance of the voltage converter circuit 120, is smaller than an RC time constant at the output node 114.

The circuit 100 having the RC time constant at the internal node 124 that is smaller than the RC time constant at the output node 114 allows a frequency bandwidth of the circuit 100 to be dominated by the characteristics of the load 140 and not the amplifier circuit 110 based on the following equation: $BW=1/(RC_{IN}+RC_{ON})$ where BW is the frequency bandwidth, $RC_{IN}$ is the RC time constant at the internal node 124, and $RC_{ON}$ is the RC time constant at the output node 114.

In particular, a frequency bandwidth of the circuit 100 may be dominated by the characteristics of the load 140 and not the amplifier circuit 110 when the RC time constant at the internal node 124 is an order of magnitude or more smaller than the RC time constant at the output node 114.

When the frequency bandwidth of the circuit 100 is dominated by the characteristics of the load 140 and not the amplifier circuit 110, a change in the magnitude of the RC time constant of the internal node 124 may not appreciably affect the frequency bandwidth of the circuit 100. Thus, changes to the voltage converter circuit 120 or current converter circuit 130 that change the magnitude of the RC time constant of the internal node 124 may not appreciably affect the frequency bandwidth of the circuit 100. For example, if the RC time constant of the internal node 124 is 1 microsecond and the RC time constant of the output node 114 is 10 microseconds, a 20 percent increase in the RC time constant of the internal node 124 to 1.2 microseconds may only change the frequency bandwidth of the circuit 100 by less than 2 percent.

The amount of change in the magnitude of the RC time constant of the internal node 124 that may not appreciably affect the frequency bandwidth of the circuit 100 may depend on the relative magnitudes of the RC time constants of the output node 114 and the internal node 124. For example, a 20 percent change in the RC time constant of the internal node 124 may have a larger effect on the frequency bandwidth of the circuit 100 when the RC time constant of the internal node 124 is less than an order of magnitude smaller than the RC time constant of the output node 114 as compared to when the RC time constant of the internal node 124 is more than an order of magnitude smaller than the RC time constant of the output node 114.

A change in the magnitude of the RC time constant of the internal node 124 may occur when the gain of the voltage converter circuit 120 is increased. An increase of the gain of the voltage converter circuit 120 may increase the capacitance at the internal node 124 and thus the magnitude of the RC time constant of the internal node 124. However, an increase in the magnitude of the RC time constant of the internal node 124 may not appreciably affect the frequency bandwidth of the circuit 100. As a result, the frequency bandwidth of the circuit 100 may be approximately maintained when the gain of the voltage converter circuit 120 is increased. As described herein, the frequency bandwidth of the circuit 100 may be approximately maintained when the gain of the voltage converter circuit 120 is increased if the frequency bandwidth of the circuit 100 changes less than 1% for every 10% change in gain.

The amplifier circuit 110 may be configured to approximately maintain the frequency bandwidth of the circuit 100 when the gain of the voltage converter circuit 120 is increased using active circuit elements, such as transistors, diodes, operational amplifiers, among others. In some embodiments, the amplifier circuit 110 may also be configured to use passive circuit elements, such as resistors and capacitors, along with one or more active circuit elements, to approximately maintain the frequency bandwidth of the circuit 100 when the gain of the voltage converter circuit 120 is increased. In these and other embodiments, the amplifier circuit 110 may not use inductors, and thus inductive peaking, to approximately maintain the frequency bandwidth of the circuit 100 when the gain of the voltage converter circuit 120 is increased.

In some embodiments, the amplifier 110 may be configured to approximately maintain the frequency bandwidth of the circuit 100 when the gain of the voltage converter circuit 120 is increased when the circuit 100 is designed to support high speed signals, such as signals with data rates that are higher than 500 megabits/second, 1 gigabits/second, 5 gigabits/second, 10 gigabits/second, 20 gigabits/second, or higher. In these and other embodiments, the frequency bandwidth of the circuit 100 may be 500 megaHertz, 1 gigaHertz, 5 gigaHertz, 10 gigaHertz, 20 gigaHertz, or higher.

In some embodiments, the amplifier 110 may be included within a high-speed circuit or high speed electrical component, such as a high-speed serializer and/or deserializer. In these and other embodiments, the RC time constant at the internal node 124 may be smaller than the RC time constant at the output node 114 of the circuit 100.

Figure 2:
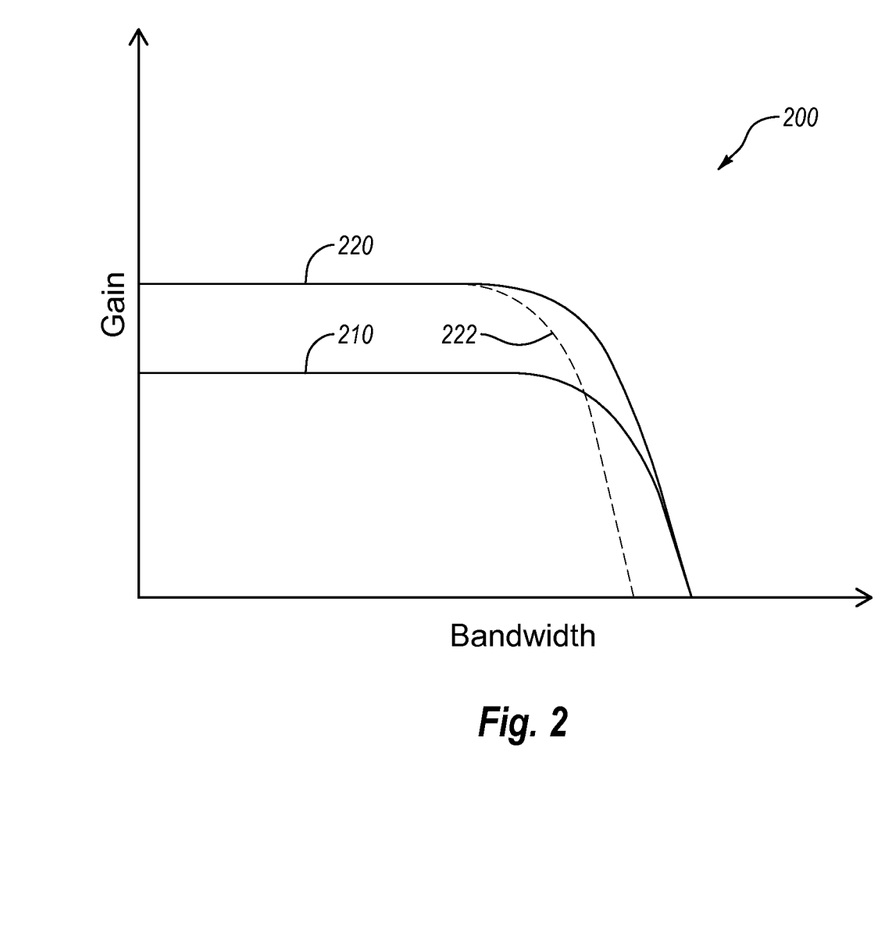
FIG. 2 is a graph of gain over frequency bandwidth of the circuit of FIG. 1.

FIG. 2 is a graph 200 of gain over frequency bandwidth of the circuit 100 of FIG. 1, arranged in accordance with at least some embodiments described herein. The graph 200 has an x-axis that represents the frequency bandwidth of the circuit 100. The y-axis represents a gain of the voltage converter circuit 120 of the amplifier circuit 110. The graph 200 includes two curves, including a curve 210 and a curve 220. The curve 210 represents the frequency bandwidth of the circuit 100 when the amplifier circuit 110 has a first gain. The curve 220 represents the frequency bandwidth of the circuit 100 when the amplifier circuit 110 has a second gain higher than the first gain. The frequency bandwidth of the circuit 100 is approximately maintained when the circuit 100 has either the first gain or the second gain. The line 222 illustrates a frequency bandwidth of the circuit 100 when the circuit 100 has the second gain and the current converter circuit 130 fails to buffer the current signal from the voltage converter circuit 120. As depicted by line 222, the frequency bandwidth of the circuit 100 is substantially decreased when the current converter circuit 130 fails to buffer the current signal from the voltage converter circuit 120 and the gain of the circuit 100 is increased.

Figure 3A:
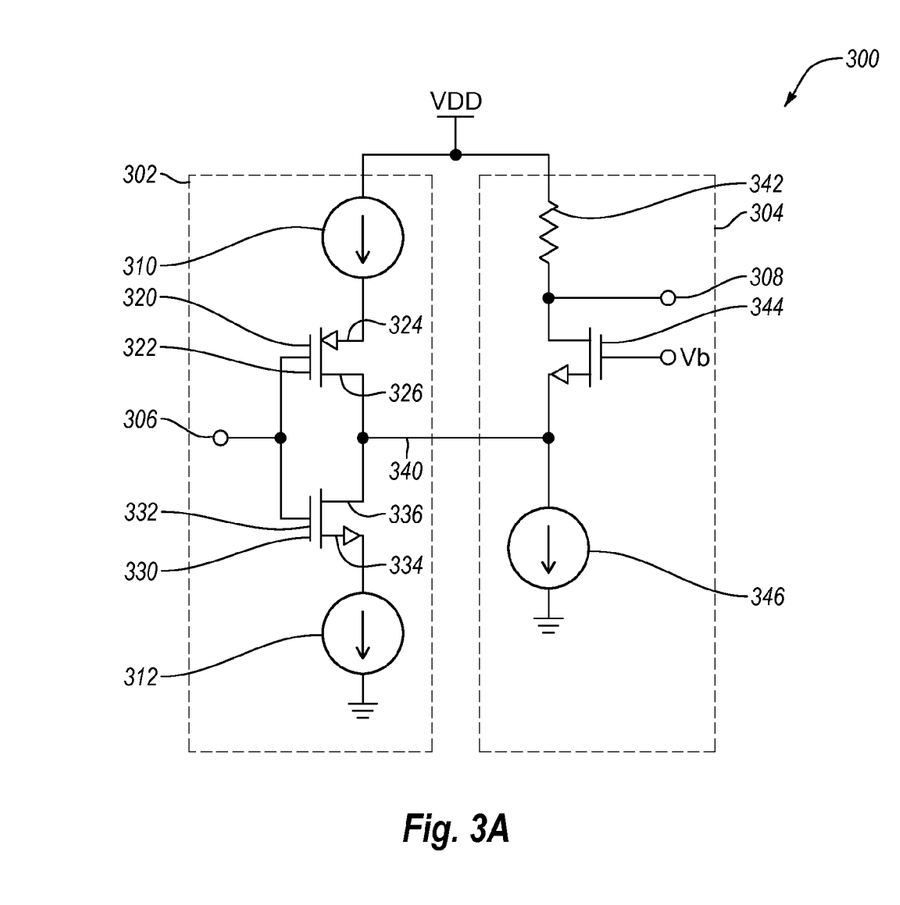
FIGS. 3A-3D illustrate example amplifier circuits.

FIG. 3A illustrates an example amplifier circuit 300, arranged in accordance with at least some embodiments described herein. The amplifier circuit 300 may include a gain stage 302 that is coupled to a buffer stage 304 by an internal node 340. In some embodiments, the gain stage 302 and the buffer stage 304 may correspond to the voltage converter circuit 120 and the current converter circuit 130 of FIG. 1, respectively.

The gain stage 302 may be configured to amplify an input voltage signal received on an input node 306 of the amplifier circuit 300 and to convert the input voltage signal to a current signal. The gain stage 302 may amplify and convert the input voltage signal using first and second transistors 320, 330. The first transistor 320 may include a gate 322, a source 324, and a drain 326 and may be a p-type transistor. The second transistor 330 may also include a gate 332, a source 334, and a drain 336 and may be an n-type transistor. The gates 322, 332 of the first and second transistors 320, 330, respectively, may be coupled to the input node 306. The drains 326, 336 may be coupled to the internal node 340. Coupling the gates 322, 332 of the first and second transistors 320, 330 to the input node 306 may provide an effective transconductance of the gain stage 302 equal to the sum of the transconductance of each of the first and second transistors 320, 330. Alternately or additionally, coupling the gates 322, 332 of the first and second transistors 320, 330 to the input node 306 may allow the gain stage 302 to support a wider input common mode range. For example, if the input common mode is low, the transconductance of the second transistor 330 may be low but the transconductance of the first transistor 320 may be high to assist in offsetting the low transconductance of the second transistor 330.

To convert the input voltage signal to the current signal, the first transistor 320 may convert the input voltage signal at the gate 322 of the first transistor 320 to a first transistor current signal at the drain 326. The second transistor 330 may convert the input voltage signal at the gate 332 of the second transistor 330 to a second transistor current signal at the drain 336. The first and second transistor current signals may be combined to form the current signal sent to the buffer stage 304. Thus, the gain of the gain stage 302 may be equal to the combination of the transconductance of the first and second transistors 320, 330.

The gain stage 302 may further include first and second biasing current sources 310, 312. Each of the first and second biasing current sources 310, 312 may include one or more transistors. In some embodiments, each of the first and second biasing current sources 310, 312 may include one or more active circuit elements and/or one or more passive circuit elements. The first and second biasing current sources 310, 312 may be used by the gain stage 302 to place the first and second transistors 320, 330 in the proper operational mode, such as a linear mode or an active mode, for converting the input voltage signal to the current signal and amplifying the input voltage signal.

The buffer stage 304 may receive the current signal from the gain stage 302 and may be configured to convert the current signal to an output voltage signal. The buffer stage 304 may place the output voltage signal on an output node 308. In some embodiments, the buffer stage 304 may have approximately a unity gain.

The buffer stage 304 may also be configured to buffer the current signal from the gain stage 302. The buffer stage 304 may buffer the current signal from the gain stage 302 by providing an input impedance at the internal node 340 with a low enough value so that a RC time constant at the internal node 340, resulting from the input impedance of the buffer stage 304 and a parasitic capacitance of the gain stage 302, is smaller than a RC time constant at the output node 308.

The buffer stage 304 may be implemented using active circuit elements and/or a combination of active circuit elements and passive circuit elements. FIGS. 3A-3D illustrate various embodiments of buffer stages 304 that may be used in the amplifier circuit 300.

The buffer stage 304 of FIG. 3A may include a resistor 342, a transistor 344, and a biasing current source 346. The internal node 340 may be coupled between the source of the transistor 344 and the biasing current source 346. The output voltage node 308 may be at the node between the resistor 342 and the drain of the transistor 344. The gate of the transistor 344 may be held at a biasing voltage Vb. The current signal may pass through the transistor 344 and produce a voltage across the resistor 342. The voltage across the resistor 342 may be the output voltage signal on the output node 308. The configuration of circuit elements within the buffer stage 304 may buffer the capacitance from the output node 308 from affecting the gain stage 302 and may provide a low input impedance at the internal node 340.

The gain of the buffer stage 304 may be approximately a unity gain. By having the gain of the buffer stage 304 be approximately a unity gain, the gain of the amplifier circuit 300 may be higher and maintained closer to the gain of the gain stage 302 than might otherwise be the case if the gain of the buffer stage 304 were other than a unity gain. In some embodiments, the biasing current source 346 may include one or more active circuit elements and/or one or more passive circuit elements. The biasing current source 346 and the voltage level of the biasing voltage Vb may be used to place the transistor 344 in the proper operational mode for converting the current signal to the output voltage signal. Alternately or additionally, the biasing current source 346 and the voltage level of the biasing voltage Vb may be adjusted to reduce the input impedance of the buffer stage 304 at the internal node 340.

Figure 3B:
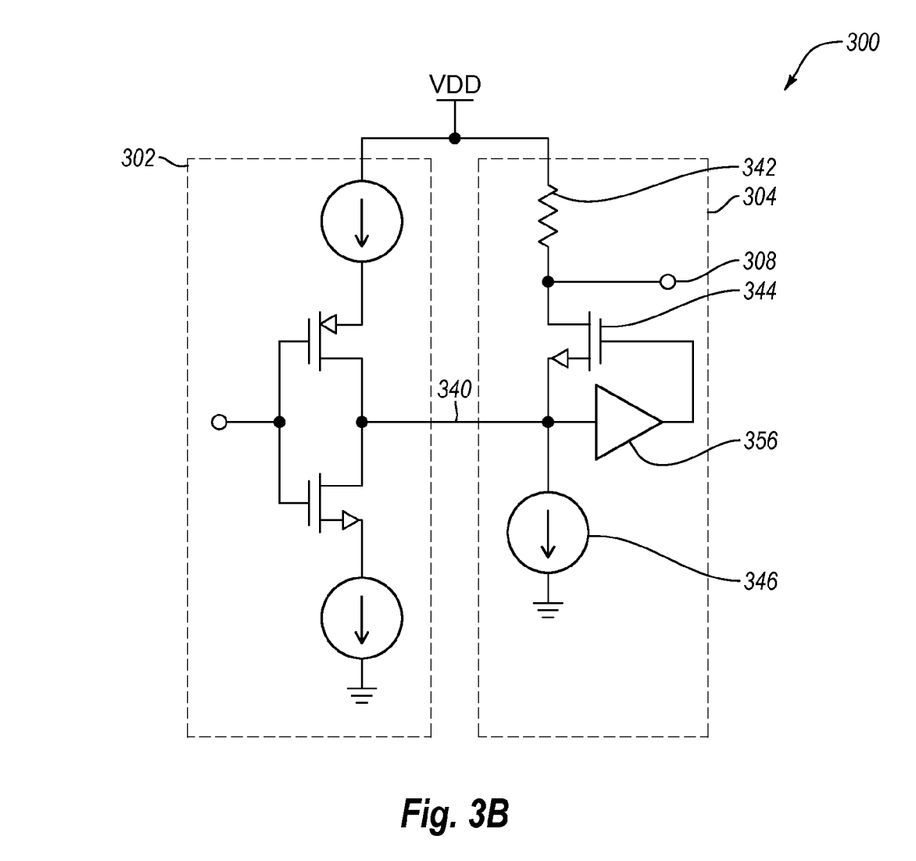
Figure 3C:
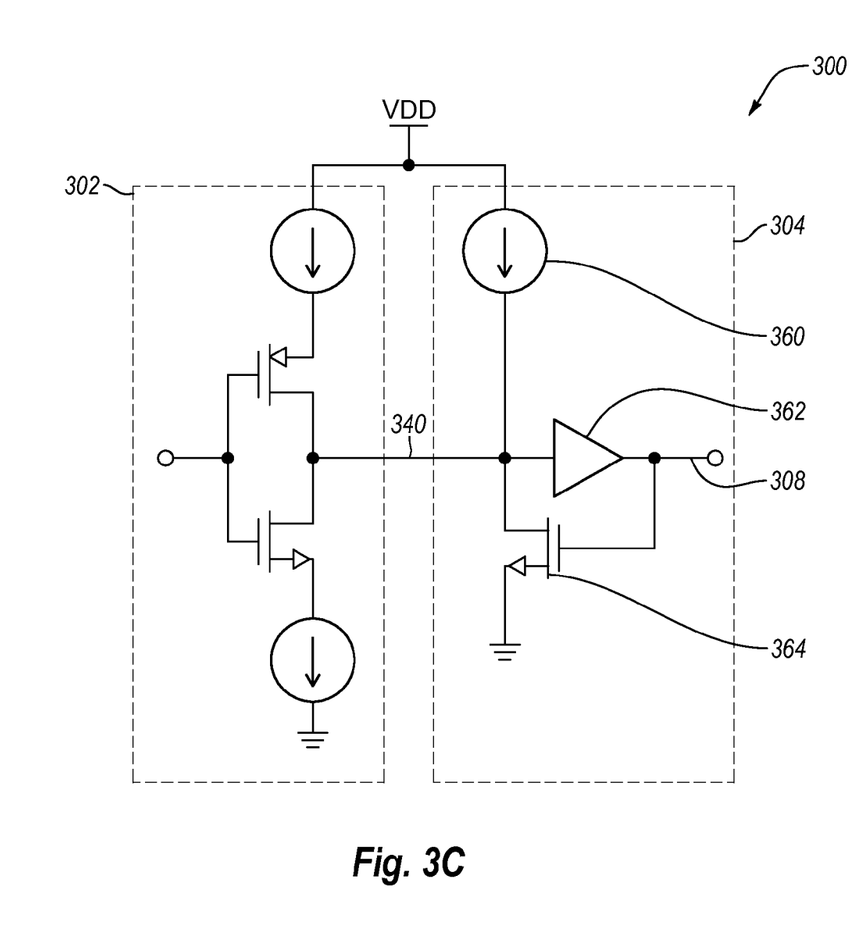
Figure 3D:
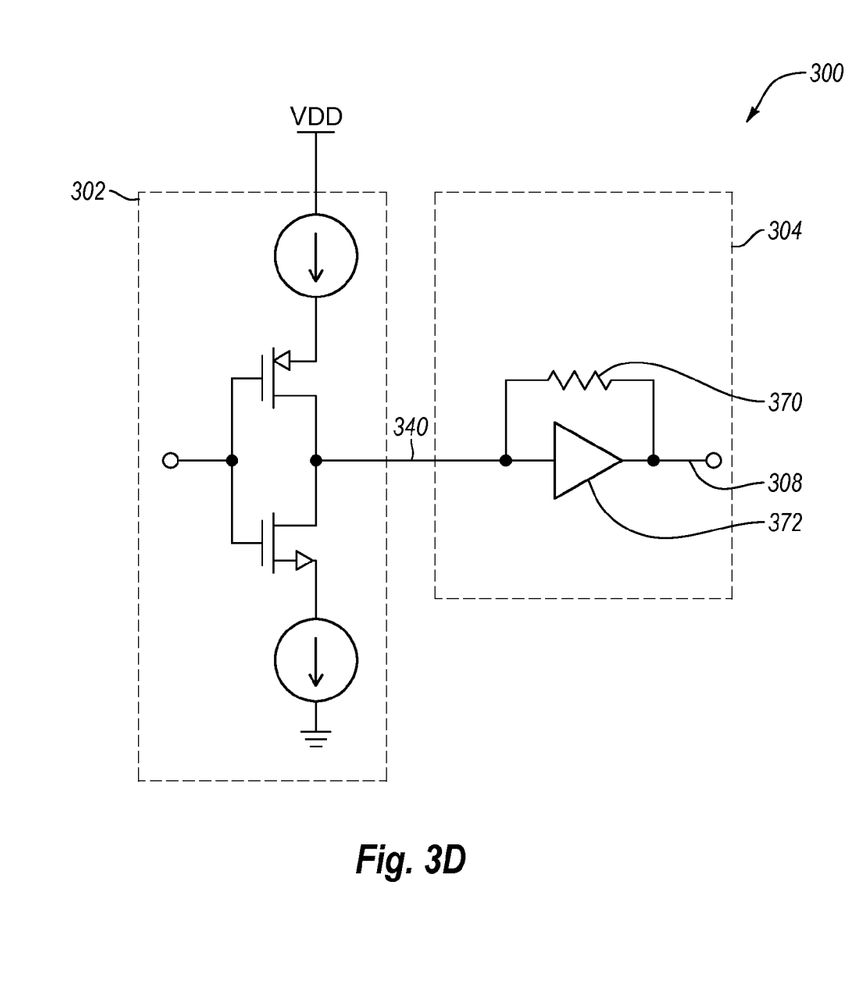

FIGS. 3B-3D will next be described. In the description of FIGS. 3B-3D, a description of the gain stage 302 has been omitted as the gain stage 302 implemented in the various embodiments of the circuit 300 described with respect to FIGS. 3A-3D may be the same. Accordingly, reference may be made to the above description of the gain stage 302.

The buffer stage 304 of FIG. 3B may be similar to the buffer stage 304 of FIG. 3A, but may further include an amplifier 356 coupled between the gate of the transistor 344 and the internal node 340. The amplifier 356 may assist in providing a lower input impedance for the buffer stage 304 at the internal node 340.

The buffer stage 304 of FIG. 3C may include a biasing current source 360, an amplifier 362, and a transistor 364. A drain of the transistor 364, the input to the amplifier 362, and biasing current source 360 may be coupled to the internal node 340. The output node 308 may be coupled to the output of the amplifier 362 and the gate of the transistor 364. The transistor 364 may form part of a feedback loop for the amplifier 362.

The amplifier 362 may convert the current signal to the output voltage signal and output the output voltage signal on the output node 308. The gain of the amplifier 362 may provide a low input impedance at the internal node 340 for the buffer circuit 304. Alternately or additionally, the transconductance of the transistor 364 may also provide a low input impedance at the internal node 340 for the buffer circuit 304. In some embodiments, the biasing current source 360 may include one or more active circuit elements and/or one or more passive circuit elements.

The buffer stage 304 of FIG. 3D may include an amplifier 372 and a resistor 370. The input of the amplifier 372 may be coupled to the internal node 340 and the output of the amplifier 372 may be coupled to the output node 308. The resistor 370 may be coupled between the output node 308 and the internal node 340. The amplifier 372 together with the resistor 370 may convert the current signal to the output voltage signal and output the output voltage signal on the output node 308. The gain of the amplifier 372 may provide a low input impedance at the internal node 340 for the buffer circuit 304.

Figure 4:
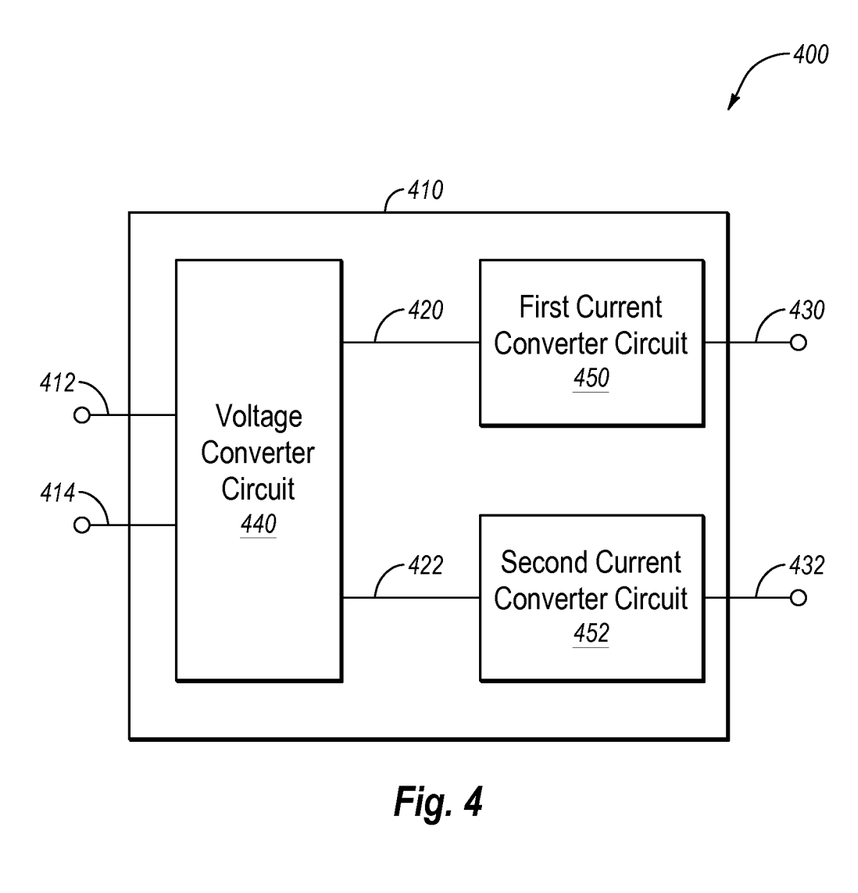
FIG. 4 illustrates another example circuit that includes an amplifier circuit.

FIG. 4 illustrates another example circuit 400 that includes an amplifier circuit 410, arranged in accordance with at least some embodiments described herein. The amplifier circuit 410 may include first and second input nodes 412, 414, first and second internal nodes 420, 422, and first and second output nodes 430, 432. The first and second input nodes 412, 414 may be coupled to a voltage converter circuit 440. The voltage converter circuit 440 may be coupled to a first current converter circuit 450 by the first internal node 420 and to a second current converter circuit 452 by the second internal node 422. The first current converter circuit 450 may be coupled to the first output node 430 and the second converter circuit 452 may be coupled to the second output node 432.

The input nodes 412, 414 may be configured to receive first and second input voltage signals and to send the input voltage signals to the voltage converter circuit 440. The voltage converter circuit 440 may be configured to convert the first input voltage signal to a first current signal and the second input voltage signal to a second current signal. The voltage converter circuit 400 may be configured to place the first and second current signals on the first and second internal nodes 420, 422, respectively.

The voltage converter circuit 440 may also be configured to amplify the input voltage signals according to a gain of the voltage converter circuit 440 when converting the input voltage signals to the current signals. In some embodiments, the gain for the first input voltage signal may be the same as or different from the gain for the second input voltage signal. Thus, the voltage converter circuit 440 may be referred to as a gain stage of the amplifier circuit 410. In some embodiments, the voltage converter circuit 440 may be similar to the voltage converter circuit 120 of FIG. 1.

The first and second current converter circuits 450, 452 may obtain the current signals from the internal nodes 420, 422, respectively. The first converter circuit 450 may be configured to convert the first current signal to a first output voltage signal. The second converter circuit 452 may be configured to convert the second current signal to a second output voltage signal. In some embodiments, the current converter circuits 450, 452 may both have approximately a unity gain.

The current converter circuits 450, 452 may also be configured to buffer the first and second current signals, respectively, from the voltage converter circuit 440 and may be referred to as a buffer stage of the amplifier circuit 410. The current converter circuits 450, 452 may buffer the first and second current signals, respectively, from the voltage converter circuit 430 in a manner previously described herein.

In some embodiments, the input voltage signals may be a differential signaling pair of input voltage signals. In these and other embodiments, the first input voltage signal and the second input voltage signal may be the high and low level input logic signals, respectively, for the differential signaling pair. The first current signal from the first input voltage signal may be converted into the first output voltage signal that may be a low-level output logic signal for the differential signaling pair. The second current signal from the second input voltage signal may be converted into the second output voltage signal that may be a high-level output logic signal for the differential signaling pair.

Figure 5:
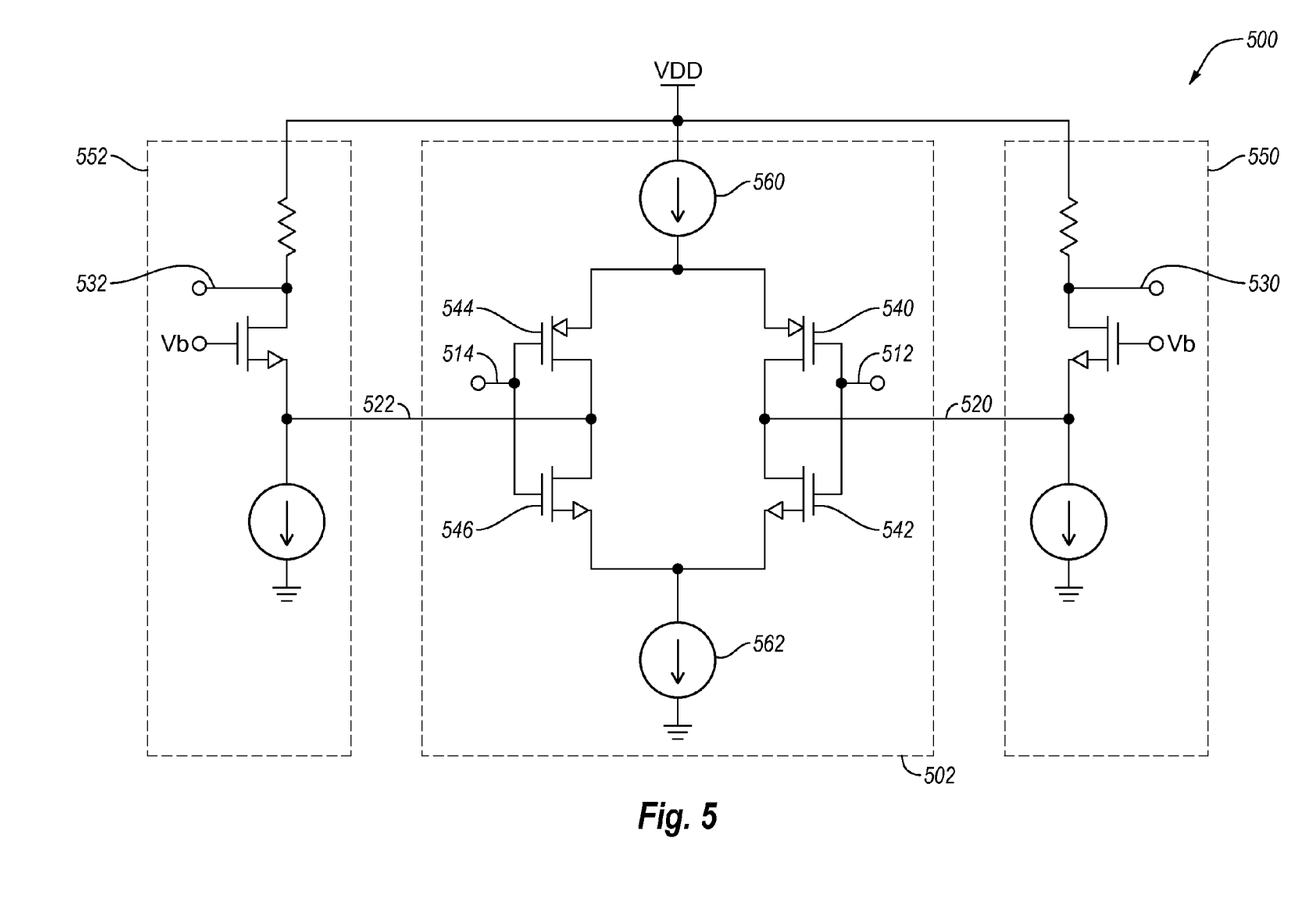
FIG. 5 illustrates another example amplifier circuit, all arranged in accordance with at least some embodiments described herein.

FIG. 5 illustrates another example amplifier circuit 500, arranged in accordance with at least some embodiments described herein. The amplifier circuit 500 may include a gain stage 502 that is coupled to first and second buffer stages 550, 552 by first and second internal nodes 520, 522, respectively. In some embodiments, the gain stage 502 and the buffer stages 550, 552 may correspond to the voltage converter circuit 440 and the current converter circuits 450, 452 of FIG. 4, respectively.

The gain stage 502 may be configured to amplify first and second input voltage signals received on first and second input nodes 512, 514 of the amplifier circuit 500 and to convert the input voltage signals to first and second current signals, respectively. The gain stage 502 may amplify and convert the first input voltage signal using first and second transistors 540, 542. The gain stage 502 may amplify and convert the second input voltage signal using third and fourth transistors 544, 546. The gates of the first and second transistors 540, 542 may be coupled to the first input node 512. The gain of the gain stage 502 for the first input voltage signal may be equal to the combination of the transconductance of the first and second transistors 540, 542. The gates of the third and fourth transistors 544, 546 may be coupled to the second input node 514. The gain of the gain stage 502 for the second input voltage signal may be equal to the combination of the transconductance of the third and fourth transistors 544, 546. The transistors 540, 542, 544, 546 may operate to convert and amplify the respective input voltage signals in a manner similar to that described with respect to the gain stage 302 of FIGS. 3A-3D.

The gain stage 502 may further include first and second biasing current sources 560, 562. In some embodiments, each of the first and second biasing current sources 560, 562 may include one or more active circuit elements and/or one or more passive circuit elements. The first and second biasing current sources 560, 562 may be used by the gain stage 502 to place the transistors 540, 542, 544, 546, in the proper operational mode, such as a linear mode or an active mode, for converting the input voltage signals to the current signals and amplifying the input voltage signals.

The first buffer stage 550 may receive the first current signal from the gain stage 502 and may be configured to convert the first current signal to a first output voltage signal. The first buffer stage 550 may place the first output voltage signal on the first output node 530. In some embodiments, the first buffer stage 550 may have approximately a unity gain.

The first buffer stage 550 may also be configured to buffer the first current signal from the gain stage 502 with respect to the first current signal by providing a first input impedance at the first internal node 520 with a low enough value so that an RC time constant at the first internal node 520 is smaller than an RC time constant at the first output node 530. In some embodiments, the first buffer stage 550 may operate in a manner similar to the buffer stage 304 of FIGS. 3A-3D.

The second buffer stage 552 may receive the second current signal from the gain stage 502 and may be configured to convert the second current signal to a second output voltage signal. The second buffer stage 552 may place the second output voltage signal on the second output node 532. In some embodiments, the second buffer stage 552 may have approximately a unity gain.

The second buffer stage 552 may also be configured to buffer the second current signal from the gain stage 502 with respect to the second current signal by providing a second input impedance at the second internal node 522 with a low enough value so that an RC time constant at the second internal node 522 is smaller than an RC time constant at the second output node 532. In some embodiments, the second buffer stage 552 may operate in a manner similar to the buffer stage 304 of FIGS. 3A-3D.

In some embodiments, the input voltage signals may include a differential signaling pair of input voltage signals. In these and other embodiments, the first input voltage signal input on the first input node 512 and the second input voltage signal input on the second input node 514 may be the high and low level input logic signals, respectively, for the differential signaling pair. After conversion and amplification by the amplifier 500, the high-level output logic signal may be output on the second output node 532 and the low-level output logic signal may be output on the first output node 530.

In some embodiments, in FIGS. 3A-3D and 5, the transistors in the amplifier circuits 300 and 500 may include complementary metal-oxide-semiconductor (CMOS) field-effect transistors (FETs), bi-polar junction transistors (BJT), junction gate field-effect transistors (JFET), insulated gate bipolar transistors, other type of transistors, or a combination of both. The above description references the gate, drain, and source of various transistors. The above description uses the nomenclature gate, drain, and source generically to represent different portions of a transistor. The use of the names gate, drain, and source may be used to describe generically the parts of a CMOS FET, BJT, JFET, or insulated gate bipolar transistor. In some embodiments, additional active and/or passive circuit elements may be included in amplifier circuits 300, 500.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. An amplifier circuit comprising:
   a first input node configured to receive a first input voltage signal;
   a first output node configured to output a first output voltage signal;
   a voltage converter circuit including one or more voltage converter components configured to convert the first input voltage signal to a first current signal; and
   a first current converter circuit coupled to the voltage converter circuit at a first internal node, the first current converter circuit including one or more first current converter components that include a first transistor coupled between the first internal node and the first output node and an amplifier coupled between the first internal node and a gate of the first transistor,
   wherein the first current converter circuit is configured to convert the first current signal to the first output voltage signal and to buffer the first current signal from the voltage converter circuit so that a first internal node Resistance-Capacitance (RC) time constant at the first internal node, due to one or more of the one or more voltage converter components or the one or more of the first current converter components, is smaller than a first output node RC time constant at the first output node due to a load coupled to the first output node or one or more of the first current converter components, such that an increase in a gain of the voltage converter circuit does not appreciably affect a bandwidth of the amplifier circuit.

2. The amplifier circuit of claim 1, wherein the first current converter circuit has approximately a unity gain.

3. The amplifier circuit of claim 1, wherein the gain of the voltage converter circuit is greater than a gain of the first current converter circuit.

4. The amplifier circuit of claim 1, wherein the first internal node RC time constant is an order of magnitude smaller than the first output node RC time constant.

5. The amplifier circuit of claim 1, wherein the amplifier of the first current converter circuit comprises one or more passive circuit elements consisting of resistors.

6. The amplifier circuit of claim 1, wherein the one or more voltage converter components comprise two active circuit elements.

7. The amplifier circuit of claim 6, wherein the two active circuit elements comprise second and third transistors, wherein a gate of each of the second and third transistors is coupled to the input node.

8. The amplifier circuit of claim 1, further comprising:
   a second input node configured to receive a second input voltage signal;
   a second output node configured to output a second output voltage signal; and
   a second current converter circuit including one or more second current converter components coupled to the voltage converter circuit at a second internal node, the voltage converter circuit configured to convert the second input voltage signal to a second current signal and the second current converter circuit configured to convert the second current signal to the second output voltage signal and to buffer the second current signal from the voltage converter circuit so that a second internal node RC time constant at the second internal node, due to one or more of the one or more voltage converter components or the one or more of the second current converter components, is smaller than a second output node RC time constant at the second output node due to a second load coupled to the first output node or one or more of the first current converter components.

9. The amplifier circuit of claim 8, wherein the first and second input voltage signals comprise a differential signaling pair of input voltage signals.

10. The amplifier circuit of claim 9, wherein the first input voltage signal and the second input voltage signal comprise high and low level input logic signals, respectively, and the first output voltage signal and the second output voltage signal comprise low- and high-level output logic signals, respectively.

11. An amplifier circuit comprising:
    a gain stage configured to convert a first input voltage signal to a first current signal and to amplify the first input voltage signal according to a first gain; and
    a first buffer stage coupled to the gain stage at a first internal node, the first buffer stage configured to convert the first current signal to a first output voltage signal on a first output node and to buffer the first current signal from the gain stage so that a frequency bandwidth of the amplifier circuit may be approximately maintained when the first gain of the gain stage is increased,
    wherein the first buffer stage includes a first transistor coupled between the first internal node and the first output node and an amplifier coupled between the first internal node and a gate of the first transistor such that an increase in the first gain of the gain stage does not appreciably affect a bandwidth of the amplifier circuit.

12. The amplifier circuit of claim 11, wherein the first buffer stage has approximately a unity gain.

13. The amplifier circuit of claim 11, wherein the amplifier of the first buffer stage further comprises one or more passive circuit elements consisting of resistors.

14. The amplifier circuit of claim 11, wherein the gain stage comprises second and third transistors, wherein a gate of the third transistor and a gate of the second transistor are coupled together and receive the first input voltage signal.

15. The amplifier circuit of claim 14, wherein a drain of the third transistor and a drain of the second transistor are coupled to the first internal node.

16. The amplifier circuit of claim 14, wherein the third and second transistors comprise complementary metal-oxide-semiconductor field-effect transistors, bipolar junction transistors, junction gate field-effect transistors, or insulated gate bipolar transistors.

17. The amplifier circuit of claim 11, wherein the gain stage is further configured to increase a power of a second input voltage signal according to a second gain and to convert the second input voltage signal to a second current signal.

18. The amplifier circuit of claim 17, further comprising a second buffer stage coupled to the gain stage at a second internal node, the second buffer stage configured to convert the second current signal to a second output voltage signal and to buffer the second current signal from the gain stage so that the frequency bandwidth of the amplifier circuit may be approximately maintained when the second gain of the gain stage is increased.

19. The amplifier circuit of claim 17, wherein the first and second input voltage signals comprise a differential signaling pair of input voltage signals.

20. An amplifier circuit comprising:
- a first input node configured to receive a first input voltage signal;
- a second input node configured to receive a second input voltage signal, the first and second input voltage signals comprising a differential signal;
- a first output node configured to output a first output voltage signal;
- a second output node configured to output a second output voltage signal;
- a voltage converter circuit including one or more voltage converter components configured to convert the first input voltage signal to a first current signal and to convert the second input voltage signal to a second current signal, the voltage converter circuit configured to apply a gain to the both the first and second input voltage signals;
- a first current converter circuit coupled to the voltage converter circuit at a first internal node, the first current converter circuit including one or more first current converter components that include a first transistor coupled between the first internal node and the first output node and a first amplifier coupled between the first internal node and a gate of the first transistor, the first current converter circuit configured to convert the first current signal to the first output voltage signal and to buffer the first current signal from the voltage converter circuit so that a first internal node Resistance-Capacitance (RC) time constant at the first internal node, due to one or more of the one or more voltage converter components or the one or more of the first current converter components, is an order of magnitude smaller than a first output node RC time constant at the first output node, due to a first load coupled to the first output node or one or more of the first current converter components; and
- a second current converter circuit coupled to the voltage converter circuit at a second internal node, the second current converter circuit including one or more second current converter components that include a second transistor coupled between the second internal node and the second output node and a second amplifier coupled between the second internal node and a gate of the second transistor, the second current converter circuit configured to convert the second current signal to the second output voltage signal and to buffer the second current signal from the voltage converter circuit so that a second internal node RC time constant at the second internal node, due to one or more of the one or more voltage converter components or the one or more of the second current converter components, is an order of magnitude smaller than a second output node RC time constant at the second output node, due to a second load coupled to the second output node or one or more of the second current converter components, such that an increase in the gain of the voltage converter circuit does not appreciably affect a bandwidth of the amplifier circuit.

* * * * *